(12) United States Patent
Lima et al.

(10) Patent No.: US 11,740,548 B2
(45) Date of Patent: Aug. 29, 2023

(54) ULTRA-THIN, ULTRA-LOW DENSITY FILMS FOR EUV LITHOGRAPHY

(71) Applicant: LINTEC OF AMERICA, INC., Plano, TX (US)

(72) Inventors: Marcio D. Lima, Richardson, TX (US); Takahiro Ueda, Frisco, TX (US)

(73) Assignee: LINTEC OF AMERICA, INC., Plano, TX (US)

( * ) Notice: Subject to any disclaimer, the term of this patent is extended or adjusted under 35 U.S.C. 154(b) by 0 days.

(21) Appl. No.: 18/074,082

(22) Filed: Dec. 2, 2022

(65) Prior Publication Data

US 2023/0095318 A1     Mar. 30, 2023

Related U.S. Application Data

(63) Continuation of application No. PCT/US2021/050519, filed on Sep. 15, 2021.

(60) Provisional application No. 63/079,109, filed on Sep. 16, 2020.

(51) Int. Cl.
    *G03F 1/22*     (2012.01)
    *G03F 1/64*     (2012.01)
    *G03F 7/20*     (2006.01)
    *G03F 7/00*     (2006.01)

(52) U.S. Cl.
    CPC .................. *G03F 1/22* (2013.01); *G03F 1/64* (2013.01); *G03F 7/70983* (2013.01)

(58) Field of Classification Search
    CPC ..... G03F 1/22; G03F 1/62; G03F 1/64; G03F 7/70983
    USPC .......................................................... 430/5
    See application file for complete search history.

(56) References Cited

U.S. PATENT DOCUMENTS

| | | | |
|---|---|---|---|
| 7,767,985 | B2 | 8/2010 | Okoroanyanwu et al. |
| 2014/0087164 | A1 | 3/2014 | LeMieux et al. |
| 2016/0362299 | A1 | 12/2016 | Inoue et al. |
| 2018/0284598 | A1 | 10/2018 | Schnieders |
| 2018/0329291 | A1 | 11/2018 | Timmermans et al. |
| 2020/0201169 | A1 | 6/2020 | Mariano Juste et al. |
| 2020/0272047 | A1 | 8/2020 | Chatterjee et al. |

FOREIGN PATENT DOCUMENTS

| | | |
|---|---|---|
| JP | 2018-194838 | 12/2018 |
| JP | 2020-101788 | 7/2020 |
| TW | 202001414 | 1/2020 |

OTHER PUBLICATIONS

International Search Report issued in PCT/US2021/050519, dated Dec. 6, 2021.
Taiwanese Office Action dated Apr. 13, 2023 issued in Taiwanese patent application No. 110134441 along with corresponding English translation.
Office Action dated Jul. 11, 2023 issued in Japanese patent application No. 2022-580172 along with corresponding English translation.

*Primary Examiner* — Christopher G Young
(74) *Attorney, Agent, or Firm* — GREENBLUM & BERNSTEIN, P.L.C.

(57) ABSTRACT

A filtration formed nanostructure pellicle film is disclosed. The filtration formed nanostructure pellicle film includes a plurality of carbon nanofibers that are intersected randomly to form an interconnected network structure in a planar orientation. The interconnected structure allows for a high minimum EUV transmission rate of at least 92%, with a thickness ranging from a lower limit of 3 nm to an upper limit of 100 nm, to allow for effective EUV lithography processing.

25 Claims, 13 Drawing Sheets

FIG. 2

| | CNT Type in a Pellicle | Deflection @2Pa (mm) | | Rupture Pressure (Pa) | |
|---|---|---|---|---|---|
| | | Mean | Std Dev. | Mean | Std Dev. |
| Sample A | D/SWCNT* | 0.088502 | 0.014023683 | 186.8121 | 20.956543462 |
| Sample B | D/SWCNT* | 0.062881 | 0.013703898 | 155.9766 | 27.445570764 |
| Sample C | D/SWCNT* | 0.075983 | 0.023045370 | 136.0195 | 9.599266132 |
| Sample D | D/SWCNT* | 0.047343 | 0.005123706 | 203.6284 | 16.628719813 |
| Sample E | D/SWCNT* | 0.048257 | 0.005957017 | 188.6933 | 19.158369965 |
| Sample F | D/SWCNT* | 0.056882 | 0.004503340 | 221.1645 | 15.471704813 |
| Sample G | D/SWCNT* | 0.055100 | 0.013339663 | 192.6847 | 20.983770436 |
| Sample H | SWCNT | 0.096699 | 0.013755411 | 66.6125 | 34.672476763 |
| Sample I | MWCNT/S/FCNT** | >0.1 | | <90 | |

D/SWCNT* - DWCNT majority with presence of SWCNT.

MWCNT/S/FCNT** - previously reported minimum deflection and maximal rupture pressure for 50-80% MWCNT and 50-20% S/FWCNT composite film.

FIG. 4(A)
(I)
| Areal density (ug/cm2) | %T Mean | %T Std. Dev. | Abs Mean | Abs Std. Dev. |
|---|---|---|---|---|
| 0.62 | 93.833 | 0.197 | 0.028 | 0.001 |
| 0.77 | 92.060 | 0.365 | 0.036 | 0.002 |
| 0.94 | 90.967 | 0.163 | 0.041 | 0.001 |
| 1.49 | 85.217 | 0.366 | 0.069 | 0.002 |
| 3.11 | 72.900 | 0.965 | 0.137 | 0.006 |
(II)
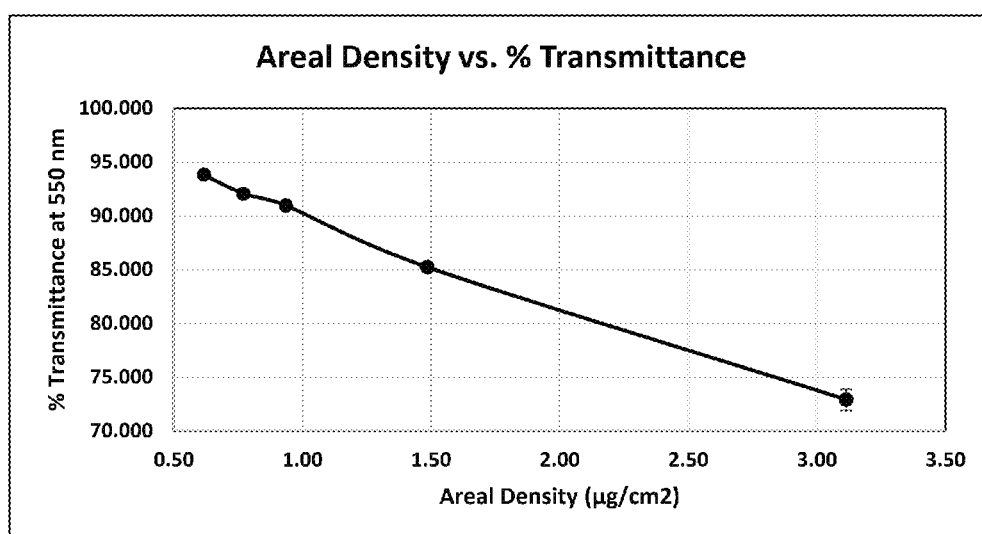
(III)
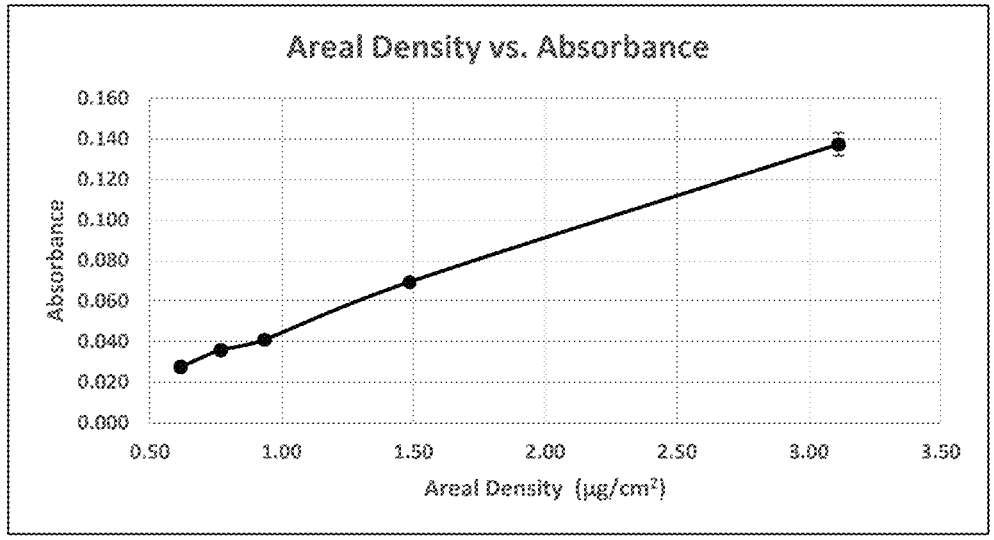

FIG. 4(B)
(I)
| Areal density (ug/cm2) | Deflection at 2Pa | | Deflection at rupture (mm) | |
|---|---|---|---|---|
| | Mean | Std. Dev. | Mean | Std. Dev. |
| 0.62 | 0.098 | 0.030 | 0.289 | 0.047 |
| 0.77 | 0.048 | 0.019 | 0.277 | 0.032 |
| 0.94 | 0.047 | 0.019 | 0.324 | 0.079 |
| 1.49 | 0.021 | 0.007 | 0.317 | 0.052 |
| 3.11 | 0.012 | 0.000 | 0.380 | 0.029 |
(II)
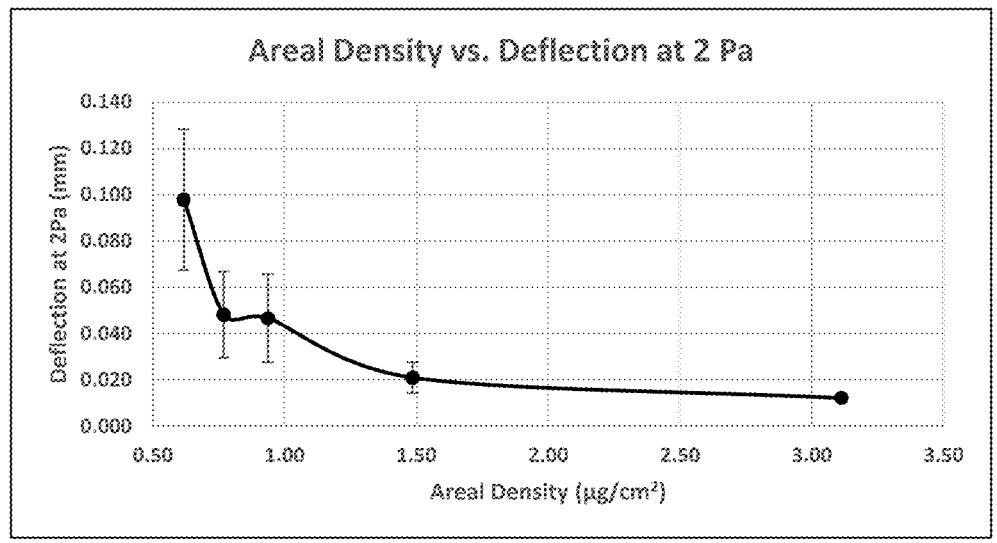
(III)
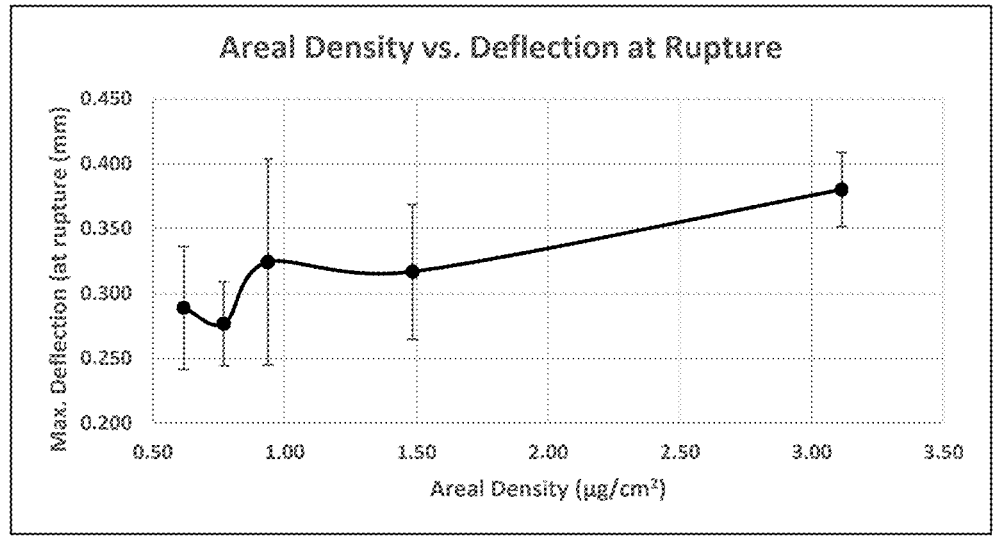

FIG. 4(C)
(I)
| DW rate (%) | MW rate (%) | Ave. Deflection @ 2 Pa | | Ave. Max. Deflection | |
|---|---|---|---|---|---|
| | | Mean | Std. Dev. | Mean | Std. Dev. |
| 100 | 0 | 0.030 | 0.019 | 0.379 | 0.050 |
| 75 | 25 | 0.029 | 0.013 | 0.345 | 0.015 |
| 50 | 50 | 0.052 | 0.012 | 0.336 | 0.022 |
| 25 | 75 | 0.072 | 0.018 | 0.307 | 0.028 |
| 0 | 100 | 0.066 | 0.007 | 0.300 | 0.020 |
(II)
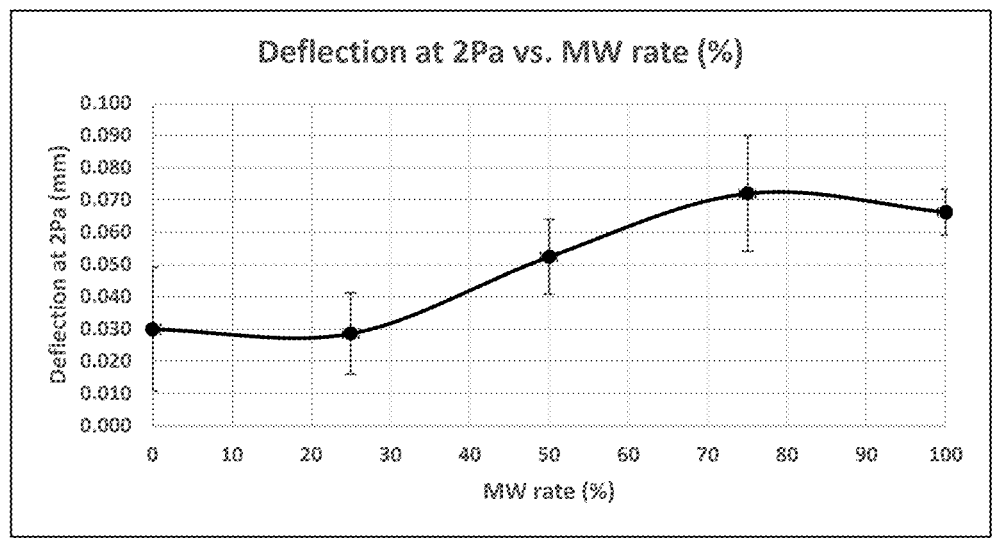
(III)
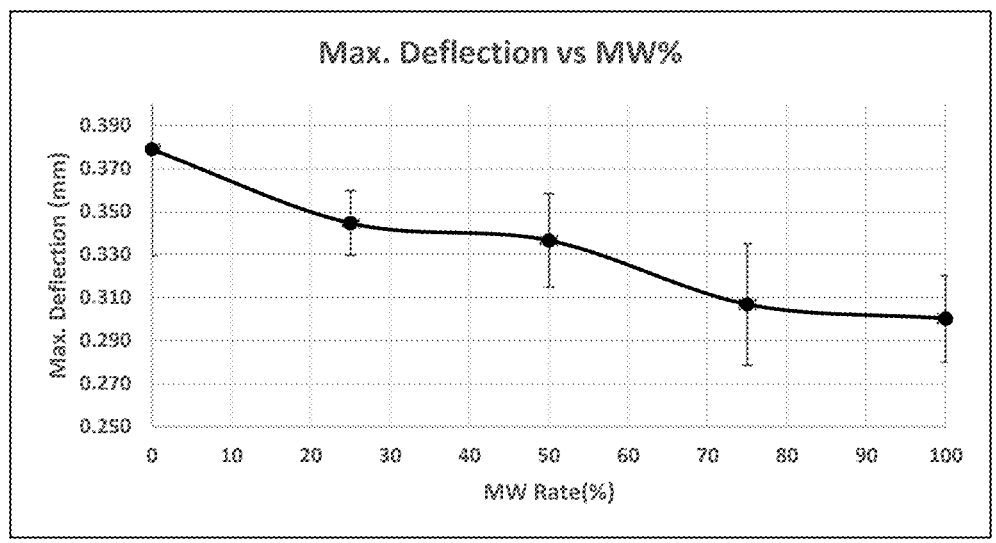

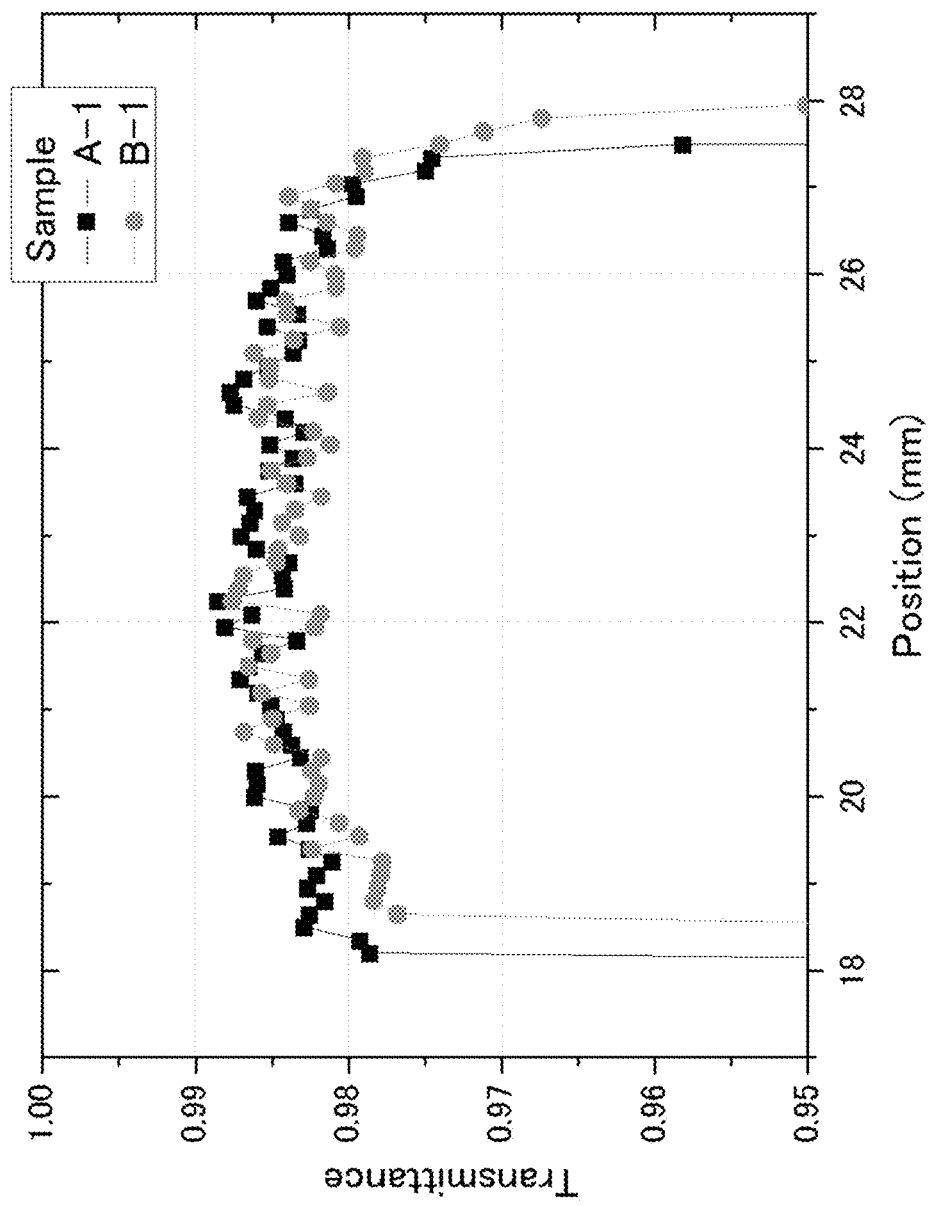

ULTRA-THIN, ULTRA-LOW DENSITY FILMS FOR EUV LITHOGRAPHY

CROSS-REFERENCE TO RELATED APPLICATIONS

This application is a continuation of Int. Pat. Appl. No. PCT/US2021/50519, filed Sep. 15, 2021, which claims the benefit of U.S. Provisional Pat. Appl. No. 63/079,109, filed Sep. 16, 2020. The disclosure of each of these documents, including the specification, drawings, and claims, is incorporated herein by reference in its entirety.

TECHNICAL FIELD

This disclosure generally relates to a thin film and thin film device used in a semiconductor microchip fabrication, and more particularly to an ultra-thin, ultra-low density, nanostructured free-standing pellicle film for extreme ultraviolet (EUV) lithography.

BACKGROUND

A pellicle is a protective cover which covers a photomask and used in semiconductor microchip fabrication. The photomask may refer to an opaque plate with holes or transparencies that allow light to shine through in a defined pattern. Such photomasks may be commonly used in photolithography and the production of integrated circuits. As a master template, the photomask is used to produce a pattern on a substrate, normally a thin slice of silicon known as a wafer in the case of semiconductor chip manufacturing.

Particle contamination can be a significant problem in semiconductor manufacturing. A photomask is protected from particles by a pellicle, a thin transparent film stretched over a frame that is attached over the patterned side of the photomask. The pellicle is close but far enough away from the mask so that moderate-to-small-sized particles that land on the pellicle will be too far out of focus to print. Recently, the microchip manufacturing industry realized that the pellicle may also protect the photomask from damage stemming from causes other than particles and contaminants.

Extreme ultraviolet lithography is an advanced optical lithography technology using a range of EUV wavelengths, more specifically, a 13.5 nm wavelength. It enables semiconductor microchip manufacturers to pattern the most sophisticated features at 7 nm resolution and beyond and put many more transistors without increasing the size of the required space. EUV photomasks work by reflecting light, which is achieved by using multiple alternating layers of molybdenum and silicon. When an EUV light source turns on, the EUV light hits the pellicle first, passes through it, and then bounces back from underneath the photomask, hitting the pellicle once more before it continues its path to print a microchip. Some of the energy is absorbed during this process and heat may be generated, absorbed, and accumulated as a result. The temperature of the pellicle may heat up to anywhere from 600 to 1000° Celsius or above.

While heat resistance is important, the pellicle must also be highly transparent for EUV, to ensure the passing through of the reflected light and light pattern from the photomask.

In 2016, a polysilicon-based EUV pellicle was developed after decades of research and effort with only 78% EUV transmission on a simulated relatively low-power 175-watt EUV source. Due to greater transistor density demand, stringent requirements present further technical challenges to EUV pellicle developers for a higher transmission rate, lower transmission variation, higher temperature tolerance, and strong mechanical strength.

Although attempts have been made to target a higher light transmittance rate by deploying a high single-walled carbon nanotube content in a carbon nanotube sheet (e.g., as high as 98% by mass), such attempts have resulted in a product that is structurally inferior, which led to decreased mechanical strength and/or durability. Accordingly, such carbon nanotube-based thin film has to provide certain level of thickness to support its structural integrity. As a result, EUV transmittance of such carbon nanotube-based thin film still did not meet the industry standard. Therefore, in the conventional technology, transmittance of EUV light and the thickness of the pellicle film have been limited from further progress.

SUMMARY

According to an aspect of the present disclosure, a specifically structured nanostructure film is disclosed. The nanostructure film includes a plurality of carbon nanofibers that are intersected randomly to form an interconnected network structure in a planar orientation, the interconnected network structure having a thickness ranging from a lower limit of 3 nm to an upper limit of 100 nm, and a minimum EUV transmission rate of 92% or above, in which the plurality of carbon nanofibers includes at least 50% of double-walled carbon nanofibers.

According to another aspect of the present disclosure, in some embodiments, a thickness ranges between the lower limit of 3 nm to an upper limit of 40 nm.

According to another aspect of the present disclosure, in some embodiments, a thickness ranges between the lower limit of 3 nm to an upper limit of 20 nm.

According to yet another aspect of the present disclosure, in some embodiments, an average thickness of the interconnected network structure is 11 nm.

According to a further aspect of the present disclosure, in some embodiments, an EUV transmission rate rises to above 95%.

According to yet another aspect of the present disclosure, in some embodiments, an EUV transmission rate rises to above 98%.

According to a further aspect of the present disclosure, the plurality of carbon nanofibers further includes single-walled carbon nanotubes and multi-walled carbon nanotubes, and a number of walls of single-walled carbon nanotubes is one, a number of walls of the double-walled carbon nanotubes is two, and a number of walls of the multi-walled carbon nanotubes is three or more.

According to another aspect of the present disclosure, the single-walled carbon nanotubes account for a percentage between 20-40% of all carbon nanotubes, double-walled carbon nanotubes account for a percentage 50% or higher all carbon nanotubes, the remaining carbon nanotubes are multi-walled carbon nanotubes.

According to a further aspect of the present disclosure, the single-walled carbon nanotubes account for more than 20% but less than 50% of all carbon nanotubes, double-walled carbon nanotubes account for more than 75% of all carbon nanotubes, the remaining carbon nanotubes are multi-walled carbon nanotubes that account for a remaining percentage of all carbon nanotubes.

According to another aspect of the present disclosure, the difference of any two EUV transmission measurements from the same nanostructure film at any focused area is less than 5%.

According to another aspect of the present disclosure, the difference of any two EUV transmission measurements from the same nanostructure film at any focused area is less than 2%.

According to another aspect of the present disclosure, the difference of any two EUV transmission measurements from the same nanostructure film at any focused area is less than 0.4%.

According to another aspect of the present disclosure, the network, especially for EUV lithography application or lithography scanner, has a deflection of less than 3.5 mm under a constant 2 Pa pressure, under a flow rate of 10 sccm, under a flow rate of 8 sccm, under 3.5 mbar/second, or any scanner conditions.

According to another aspect of the present disclosure, the deflection is less than 0.6 mm under a constant 2 Pa pressure, under a flow rate of 10 sccm, under a flow rate of 8 sccm, under 3.5 mbar/second, or under any scanner conditions.

According to another aspect of the present disclosure, the network, especially for EUV lithography application or lithography scanner, has a deflection of less than 01 mm for a full size EUV pellicle (about 110×144 mm, with 2.5 mm gap from the reticle in a scanner) when subject to a pumping down speed of 3.5 mbar/sec.

According to another aspect of the present disclosure, the network has a deflection of less than 0.1 mm under a flow rate of 3.5 mbar/second.

According to another aspect of the present disclosure, the network produces a scattering of less than 0.3% under EUV irradiation.

According to another aspect of the present disclosure, the nanofibers are conformally coated with a metal, metal oxide, or nitrides, the metal being selected from boron, ruthenium, zirconium, niobium, molybdenum, rubidium, yttrium, strontium, or rhodium.

According to another aspect of the present disclosure, the nanostructured film has an areal density of about 0.2 $\mu g/cm^2$ to about 6.0 $\mu g/cm^2$.

According to an aspect of the present disclosure, a pellicle is disclosed. The pellicle includes a pellicle border defining an aperture, and at least one nanostructured film mounted to the pellicle border and covering the aperture.

According to another aspect of the present disclosure, a method of performing EU lithography is disclosed. The method includes transmitting EUV radiation through the pellicle.

BRIEF DESCRIPTION OF THE DRAWINGS

The present disclosure is further described in the detailed description which follows, in reference to the noted plurality of drawings, by way of non-limiting examples of preferred embodiments of the present disclosure, in which like characters represent like elements throughout the several views of the drawings.

FIG. 2 illustrates different types of CNT composition in Sample A-Sample I and their mechanical properties in accordance with an exemplary embodiment.

FIG. 4(A) illustrates transparency and absorbance of DWCNT films at 550 nm for different areal densities in accordance with an exemplary embodiment.

FIG. 4(B) illustrates effect of the areal density on the deflection at 2 Pa and at rupture and permeability of DWCNT films 25×25 mm in size in accordance with an exemplary embodiment.

FIG. 4(C) illustrates effect of DWCNT/MWCNT ratio on a CNT film deflection at 2 Pa and at rupture for a film 25×25 mm and 2.9-3.0 $\mu g/cm^2$ in areal density.

FIG. 5(A) illustrates a linear map of EUV transparency of two 0.6 $\mu g/cm^2$ films 1×1 $cm^2$ in size in accordance with an exemplary embodiment.

DETAILED DESCRIPTION

Figure 1:
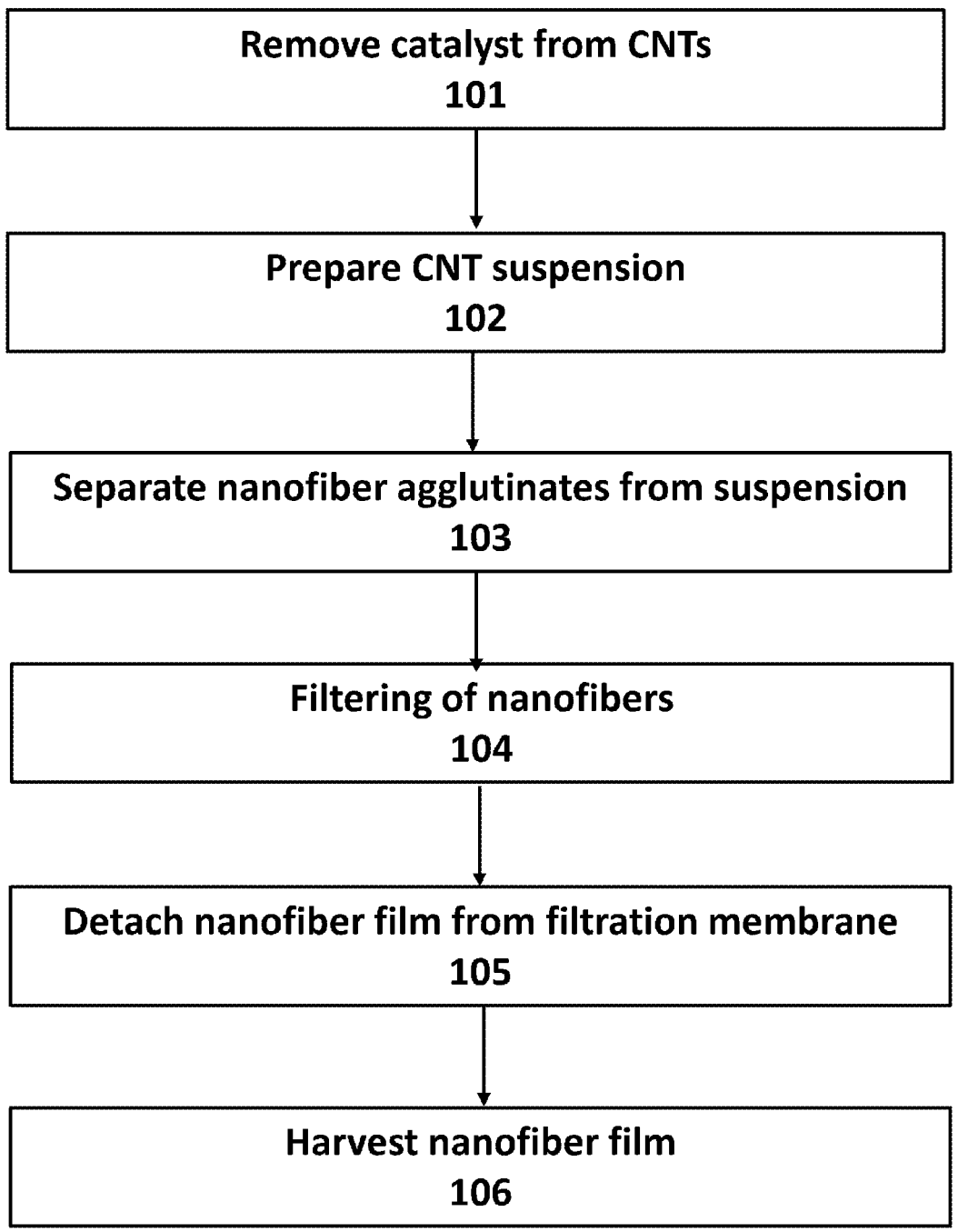
FIG. 1 illustrates a filtration method for forming a pellicle film in accordance with an exemplary embodiment.

Through one or more of its various aspects, embodiments and/or specific features or sub-components of the present disclosure, are intended to bring out one or more of the advantages as specifically described above and noted below.

A pellicle may refer to a thin transparent membrane that protects a photomask during semiconductor microchip production. The pellicle may act as a dust cover that prevents particles and contaminants from falling onto the photomask during production. However, the pellicle must be sufficiently transparent to allow transmission of light for performing lithography. A higher level of light transmission is desired for more effective lithography.

Further, pellicles for EUV lithography requires a large (e.g., greater than 110×140 mm) free-standing, thin-film material with extreme and unique properties. Besides high transparency to EUV radiation, it needs to be resistant to temperatures above 600° C. and mechanically robust to survive handling, shipping, pumping down and venting operations during the photolithographic process. Gas permeability but with capacity to retain micrometer size particles is also desired. Given the number of high-level properties required, effective EUV pellicles have been conventionally difficult to produce.

In this aspect, carbon nanotubes have been suggested as possible starting material to create pellicles for this EUV pellicle application due to their excellent thermal and mechanical properties and capability to form porous films.

Carbon Nanotubes and Carbon Nanotube Films

Carbon nanotubes (CNTs) generally have several different types, including, without limitation, single-walled CNTs (SWCNTs), double-walled CNTs (DWCNTs), multi-walled CNTs (MWCNTs) and coaxial nanotubes. They may exist substantially pure in one type or often in combination with other types. An individual CNT may be intersected with a few others. Together, many CNTs could form a mesh-like free-standing microstructure thin film. While such formation is possible, it may not be a guarantee in every trial, especially for making an ultra-thin film with high EUV transparency. As the name suggests, SWCNTs have one or single wall, DWCNTs have two walls, and MWCNTs have three or more walls.

Further, among several possible methods to fabricate free-standing films, a filtration-based approach was utilized to produce films from small-size films to sufficiently large and uniform films for EUV pellicles. This filtration-based method allows for quick manufacturing of films not only of CNTs but also other high aspect ratio nanoparticles and nanofibers such as boron nitride nanotubes (BNNT) or silver nanowires (AgNW). Since this approach separates the nanoparticles synthesis method and the film manufacturing method, a variety of types of nanotubes produced by virtually any method may be used. Different types of nanotubes can be mixed in any desired ratio. As filtration is a self-leveling process in the sense that non-uniformities of film thickness during the filtration process are self-corrected by the variations of local permeability and therefore a highly desirable film formation process, it is also a promising candidate for the production of highly uniform films.

FIG. 1 illustrates a filtration method for forming a pellicle film in accordance with an exemplary embodiment.

As illustrated in FIG. 1, a free standing carbon nanotube based pellicle film may be produced via a filtration based method. In operation 101, catalyst is removed from carbon nanotubes (CNTs) that are to be used to form a water-based suspension. In an example, prior to dispersion into a suspension, the CNTs may be chemically purified to reduce a concentration of catalyst particles to less than 1% or preferably less than 0.5% wt. as measured by thermogravimetric analysis. Removal of the catalyst is not limited to any particular process or procedure, such that any suitable process may be utilized to achieve a desirable result.

In operation 102, a water-based suspension is prepared using the purified CNTs, such that the purified CNTs are evenly dispersed in the water-based suspension. When preparing one or more CNT suspensions, carbon nanotube material can be mixed with a selected solvent to uniformly distribute nanotubes in a final solution as a suspension. Mixing can include mechanical mixing (e.g., using a magnetic stir bar and stirring plate), ultrasonic agitation (e.g., using an immersion ultrasonic probe) or other methods. In some examples, the solvent can be a protic or aprotic polar solvent, such as water, isopropyl alcohol (IPA) and aqueous alcohol mixtures, e.g., 60, 70, 80, 90, 95% IPA, N-Methyl-2-pyrrolidone (NMP), dimethyl sulfide (DMS), and combinations thereof. In an example, a surfactant can also be included to aid the uniform dispersion of carbon nanofibers in the solvent. Examples of surfactants include, but are not limited to, anionic surfactants.

Carbon nanofiber films are generally formed from one of MWCNTs, DWCNTs, or SWCNTs. A carbon nanofiber film may also include a mixture of different types of CNTs (i.e., SWCNTs, DWCNTs, and/or MWCNTs) with a variable ratio between the different types of CNTs.

Each of these three different types of carbon nanotubes (MWCNT, DWCNT and SWCNT) has different properties. In one example, single wall carbon nanotubes can be more conveniently dispersed in a solvent (i.e., with the majority of nanotubes suspended individually and not adsorbed onto other nanotubes) for subsequent formation into a sheet of randomly oriented carbon nanotubes. This ability of individual nanotubes to be uniformly dispersed in a solvent can in turn produce a more planarly uniform nanotube film formed by removing the solvent from the suspended nanofibers. This physical uniformity can also improve the uniformity of the properties across the film (e.g., transparency to irradiation).

As used herein, the term "nanofiber" means a fiber having a diameter less than 1 μm. As used herein, the terms "nanofiber" and "nanotube" are used interchangeably and encompass both single wall carbon nanotubes, double wall carbon nanotubes and/or multiwall carbon nanotubes in which carbon atoms are linked together to form a cylindrical structure.

In an example, the initially formed water-based CNT suspension in operation 102 may have at least above 85% purity of SWCNTs. The remaining may be a mixture of DWCNTs, MWCNTs and/or a catalyst. In other examples, a dispersed CNT suspension with various ratios of different types of CNTs may be prepared, such as about 20%/75% DWCNTs/SWCNTs, about 50%/45% DWCNTs/SWCNTs, about 70%/20% DWCNTs/SWCNTs, with MWCNTs accounted for the remaining. In an example, anionic surfactants may be utilized as the catalyst in the suspension.

In operation 103, the CNT suspension is then further purified to remove the aggregated or agglutinated CNTs from the initial mixture. In an example, different forms of CNTs, undispersed or aggregated vs. fully dispersed, may be separated from the suspension via centrifugation. Centrifugation of surfactant-suspended of carbon nanotubes may aid in decreasing the turbidity of the suspension solution and ensuring a full dispersion of the carbon nanotubes in the final suspension solution before going into the next filtration step. However, aspects of the disclosure are not limited thereto, such that other separation methods or processes may be utilized.

In operation 104, the CNT supernatant from operation 103 is then filtered through a filtration membrane to form a CNT web, a continuous sheet of film of intersecting CNTs.

In an example, one technique for making the CNT film uses water or other fluids to deposit nanotubes in a random pattern on a filter. The evenly dispersed CNT-containing mixture is allowed to pass or is forced to pass through the filter, leaving a nanotube structural layer on the surface of the filter. The size and shape of the resulting membrane are determined by the size and shape of the desired filtration area of the filter, while the thickness and density of the membrane are determined by the quantity of nanotube material utilized during the process and the permeability of the filtration membrane to the ingredients of the input material, as the permeable ingredient is captured on the surface of the filter. If the concentration of nanotubes dispersed in the fluid is known, the mass of nanotubes deposited onto the filter can be determined from the amount of fluid that passes through the filter and the film's areal density is determined by the nanotube mass divided by the total filtration area. The selected filter is generally not permeable to any CNTs.

The filtration formed CNT film may be of a combination of SWCNT, DWCNT, and/or MWCNT in differing compositions.

In operation 105, the CNT film is then detached from the filtration membrane. More specifically, carbon nanofibers may become intersected randomly to form an interconnected network structure in a planar orientation to form the thin CNT film.

In operation 106, the lifted CNT film is then harvested using a harvester frame and then be directly transferred and mounted onto virtually any solid substrate, such as a pellicle border with a defined aperture. The CNT film may be mounted to the pellicle border and cover the aperture to form a pellicle. The transferred film mounted on a metal frame or silicon frame with an opening of as small as 1×1 cm may be useful. A much larger size film is in high demand for an actual EUV scanner. CNT film characterization, such as its mechanical strength, deflection test, permeability test, deflection at a constant pressure or during pumping down conditions, may be performed. A full-size pellicle for EUV lithography scanning may require an ultra-thin, free-standing film generally larger than 110×140 mm, based on current industry standard.

Exemplary embodiment of the present disclosure covers a filtered CNT pellicle film having a different constitution from known prior art while exhibiting properties meeting or exceeding EUV lithography requirements, including, but not limited to, EUV transmittance (EUVT), EUVT evenness, low deflection, and mechanical strength under pressure changes.

This constitution of the pellicle film provides an ultra-thin pellicle film, which allows for very high EUVT (e.g., greater than 92%, 95%, or even 98%) while being extremely temperature resistant (e.g., resistant to temperatures above 600° C.) and mechanically robust. In an example, a minimum EUVT may be a value of 92% or greater.

Although the above noted disclosure was provided with respect to CNTs and water solution, aspects of the present disclosure are not limited thereto, such that different nanotubes, such as boron nitride nanotubes (BNNT), may be utilized by the same principle.

The above-mentioned thin films may also be conformally coated by various methods, including, without limitation, e-beam, chemical vapor deposition, atomic layer deposition, spin coating, dip coting, spray coating, sputtering, DC sputtering, and RF sputtering. The material may be a metal element including any one of the following, silicon, $SiO_2$, SiON, boron, ruthenium, boron, zirconium, niobium, molybdenum, rubidium, yttrium, YN, $Y_2O_3$, strontium, and/or rhodium. The material may also be any one of a metal, metal oxides or nitrides. However, aspects of the present disclosure are not limited thereto, such that a combination of materials may be used in the coating.

CNT Pellicle Microstructure

For analysis of CNT pellicle film microstructures, a carbon nanotube film sample was prepared following a standard transmission electron microscopy (TEM) sample preparation guide. The resulting high-resolution transmission electron microscopies (HRTEMs) were analyzed. A typical image with a 700K magnification may show between one CNT to eight CNTs. Applying the DiameterJ plugin tool from National Institute of Standards and Technology or similar analytic tools, HRTEM images were studied. The numbers of walls for each CNTs were counted. The exemplary results, together with other measurements, are presented in Table 1 provided below.

TABLE 1

| wall # | Sample 1 | Sample 2 | Sample 3 | Sample 4 |
|---|---|---|---|---|
| 1 | 25.0% | 38.0% | 40.0% | 21.6% |
| 2 | 73.0% | 57.0% | 51.0% | 76.5% |
| ≥3 | 2.0% | 5.0% | 9.0% | 1.0% |

As shown above, each of the CNT pellicle film samples exhibited about 51% of DWCNT composition or higher, with remaining being formed of a combination of SWCNTs and MWCNTs. Average percentage of DWCNTs across all four samples equals to a value higher than 60%.

In another test, a CNT pellicle film exhibited more than 20% of SWCNTs, more than 75% of DWCNTs, with the remaining being formed of MWCNTs.

In addition to the above, it was noted that SWCNT may account for a percentage between 20-40% of all CNTs included in the CNT pellicle film, and DWCNTs and MWCNTs account for a percentage of more than 50% and less than 10% of all carbon nanotubes, respectively.

Exemplary analysis results of Sample A through Sample G (from FIG. 2) indicates that DWCNT, when accounted for more than 50% of CNT total content, provides the best mechanical strength. More specifically, Sample A through Sample G of FIG. 2 illustrate mechanical attribute values for the DWCNT dominant CNT pellicle films.

As illustrated in FIG. 2, DWCNT dominant CNT pellicle films provide significantly higher rupture pressure values over a SWCNT pellicle film (see sample H). More specifically, the DWCNT dominant CNT pellicle films include rupture pressure values ranging from roughly 136.0 Pa to 203.6 Pa, whereas the SWCNT pellicle film has a rupture pressure of 66.6 Pa, which is less than half of the lowest rupture pressure value of the DWCNT dominant CNT pellicle films.

Further, it can also be seen in FIG. 2 that DWCNT dominant CNT pellicle films exhibits a noticeably lower deflection value at a pressure of 2 Pa. In one case, the deflection value (0.047 mm) of a DWCNT dominant CNT pellicle film sample is almost half of the deflection value (0.097 mm) of the SWCNT pellicle film. Lower deflection values allow the CNT pellicle film to stay within the permitted space in an EUV lithograph scanner.

Figure 6A:
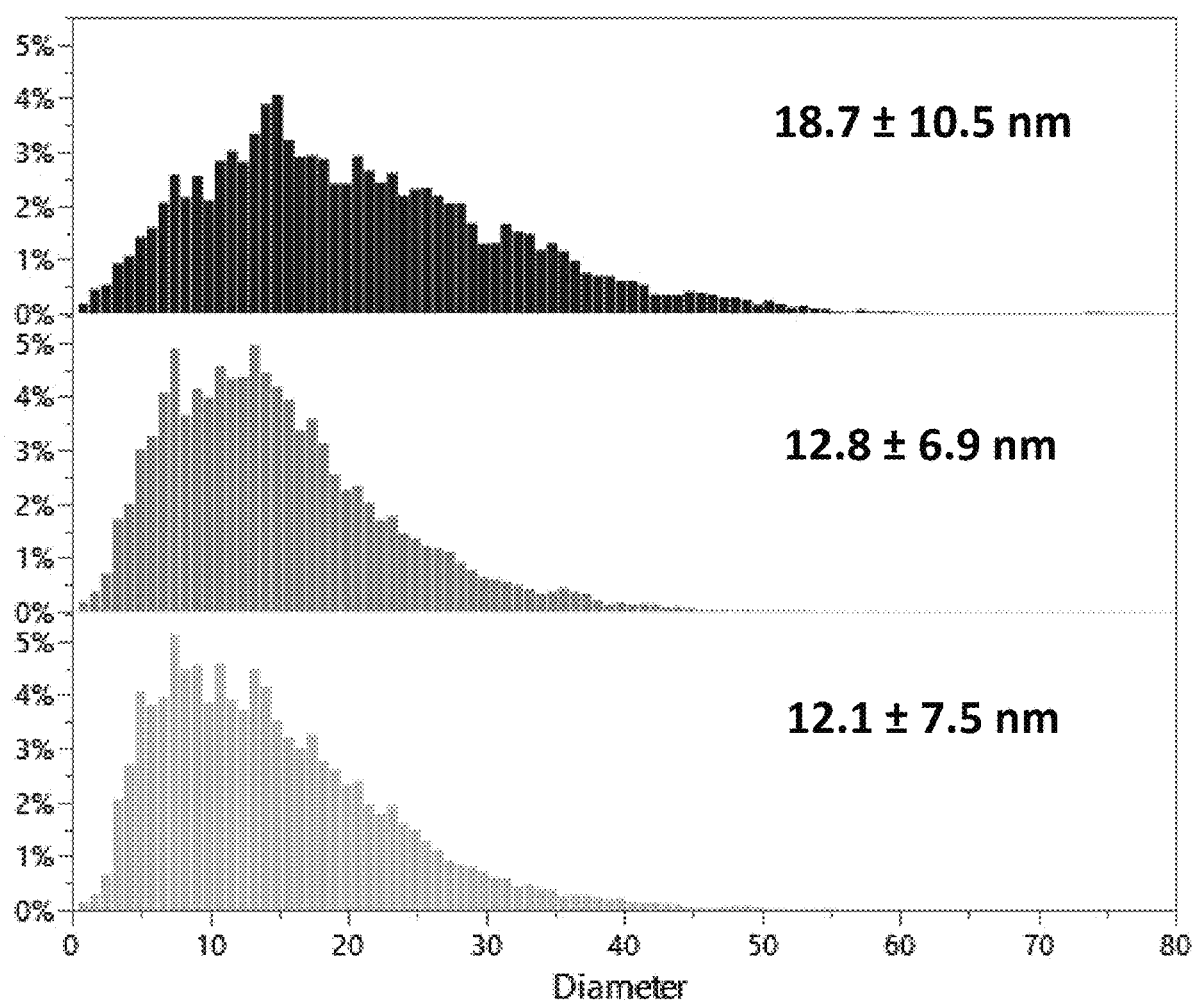
FIG. 6(A) illustrates a set of bar graphs indicating CNT bundle diameters of different samples of DWCNT majority composition films in accordance with an exemplary embodiment.
Figure 6B:
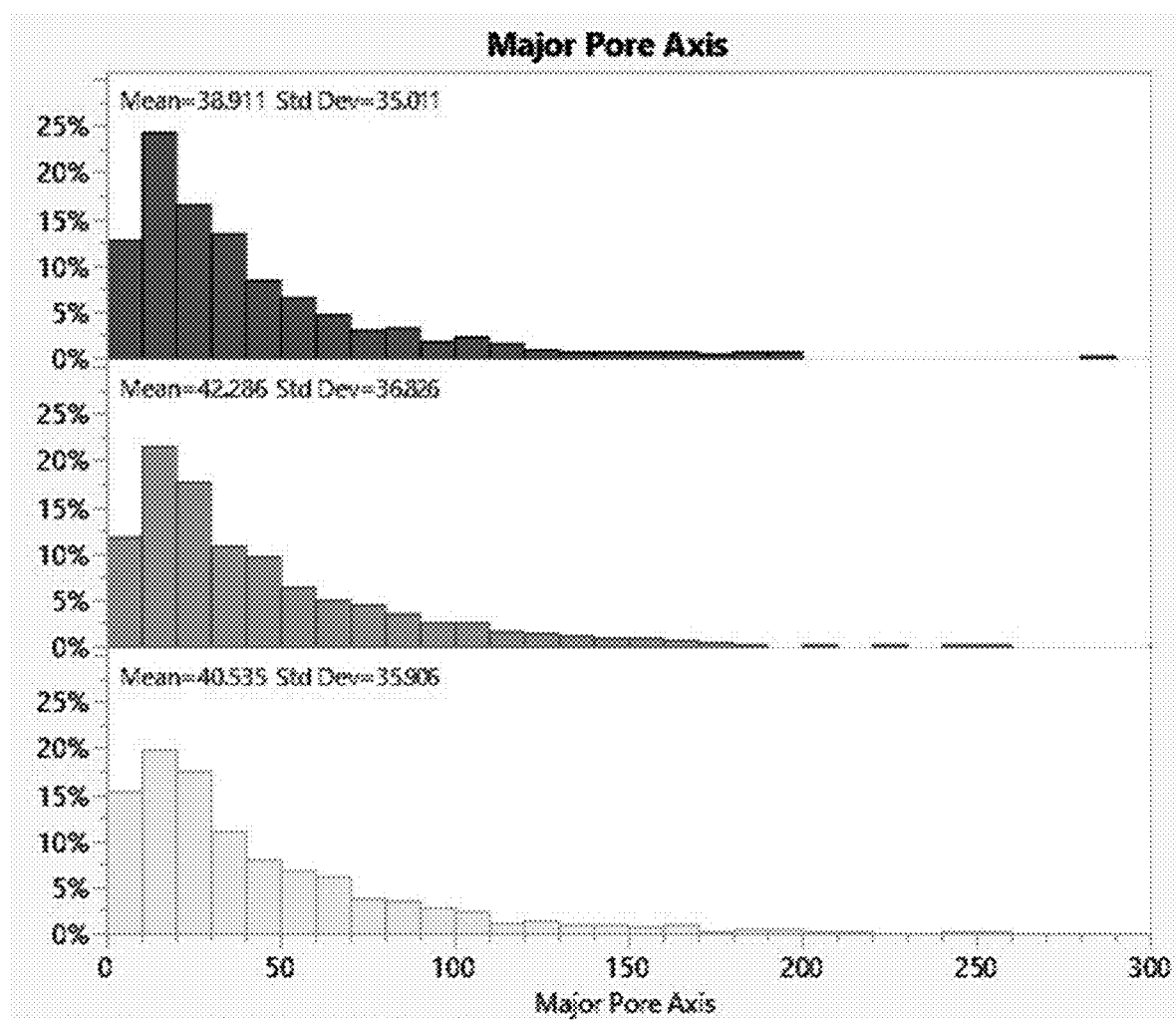
FIG. 6(B) illustrates a set of bar graphs indicating major pore axis of different samples of DWCNT majority composition films in accordance with an exemplary embodiment.

Lastly, FIG. 6(A) (200K magnification) illustrates a set of bar graphs indicating diameters of different samples of DWCNT majority composition films in accordance with an exemplary embodiment. FIG. 6(B) (100K magnification) illustrates a set of bar graphs indicating major pore axis of different samples of DWCNT majority composition films in accordance with an exemplary embodiment.

FIG. 6(A) and FIG. 6(B) illustrate an exemplary distribution of various CNT bundle diameters and pore diameters of various DWCNT majority composition film samples based on SEM image analyses. As illustrated in FIG. 6(A), the average bundle diameters for three individual samples are 18.7±10.5 nm, 12.8±6.9 nm, and 12.1±7.5 nm, respectively. Further, as illustrated in FIG. 6(B), the average pore diameters for three individual samples are 38.911±35.011 nm, 42.286±36.826 nm, and 40.535±35.906 nm, respectively.

Thin Film Thickness

An exemplary embodiment of the present disclosure is further analyzed for its thickness which is critical to determine and ensure a high EUVT. More specifically, a Dimension Icon AFM instrument was calibrated first against a National Institute of Standards and Technology (NIST) traceable standard. An area of approximately 90 μm×90 μm of CNT pellicle film was selected for AFM 2D and 3D height imaging. Step height analyses were performed to measure the film thickness. Three measurements from three carbon nanotube film samples were taken with readings of 11.8 nm, 10.6 nm, and 11.4 nm, respectively. The average thickness of the testing subject was about 11.3±0.6 nm.

Further, based on additional measurement sets, thickness values ranging from 3 nm to 100 nm, from 3 nm to 40 nm, and from 3 nm to 20 nm were provided.

In addition, thickness values may also range from 3 nm to 100 nm, from 3 nm to 40 nm, and from 3 nm to 20 nm in other samples. However, aspects of the present application are not limited thereto, such that a range may have a lower end value of 3 nm to 5 nm, and an upper end value of 20 nm to 100 nm.

Given the much higher mechanical strength exhibited by the DWCNT dominant CNT pellicle film, the DWCNT dominant CNT pellicle film may be structured to be extremely thin, to allow for higher EUVT values without sacrificing mechanical strength or integrity for use in an EUV scanner.

Visible Light and EUV Transmittance

The EUV transmittance of the sample was measured with the current industry standard of 13.5 nm wavelength. A EUVT map was created based on the EUV scanning results to demonstrate and measure variation and/or uniformity of the transmittance.

The EUV transmittance measurement and a pellicle lifetime test under the high-intensity EUV irradiation for the samples were conducted. EUV irradiation was performed with an irradiation intensity of 5.1 W/cm$^2$, equivalent to the intensity on an EUV mask with a 250 W light source, and an introduction of 5 Pa of hydrogen gas. The total EUV dose in this test is 73 kJ/cm$^2$ which is approximately equivalent to the processing of 14,000 wafers.

The filtration formed CNT pellicle film exhibits a high EUV transmission rate generally above 92%, with results above 95% or beyond 98% in some instances. See e.g., FIG. 5(A). For example, an across sample scan of a full-size pellicle film (about 110 mm×144 mm) demonstrates an average 96.69±0.15% transmission rate, while scanning the 1.5 mm×1.5 mm center region yields an average 96.75±0.03% transmission rate. A much stringent criteria to evaluate EUVT uniformity is used to calculate the difference of any two EUVT measurements from the same nanostructure film at any focused area. This requirement can be less than 5%, less than 2%, or even less than 1.0% or lower. For a full-size pellicle of this exemplary embodiment, a multi-point EUVT uniformity test results (100-point measurement per sample) demonstrate some tiny variation of less than 1.5%, less than 0.9%, 0.6%, or less than 0.4%.

Figure 5B:
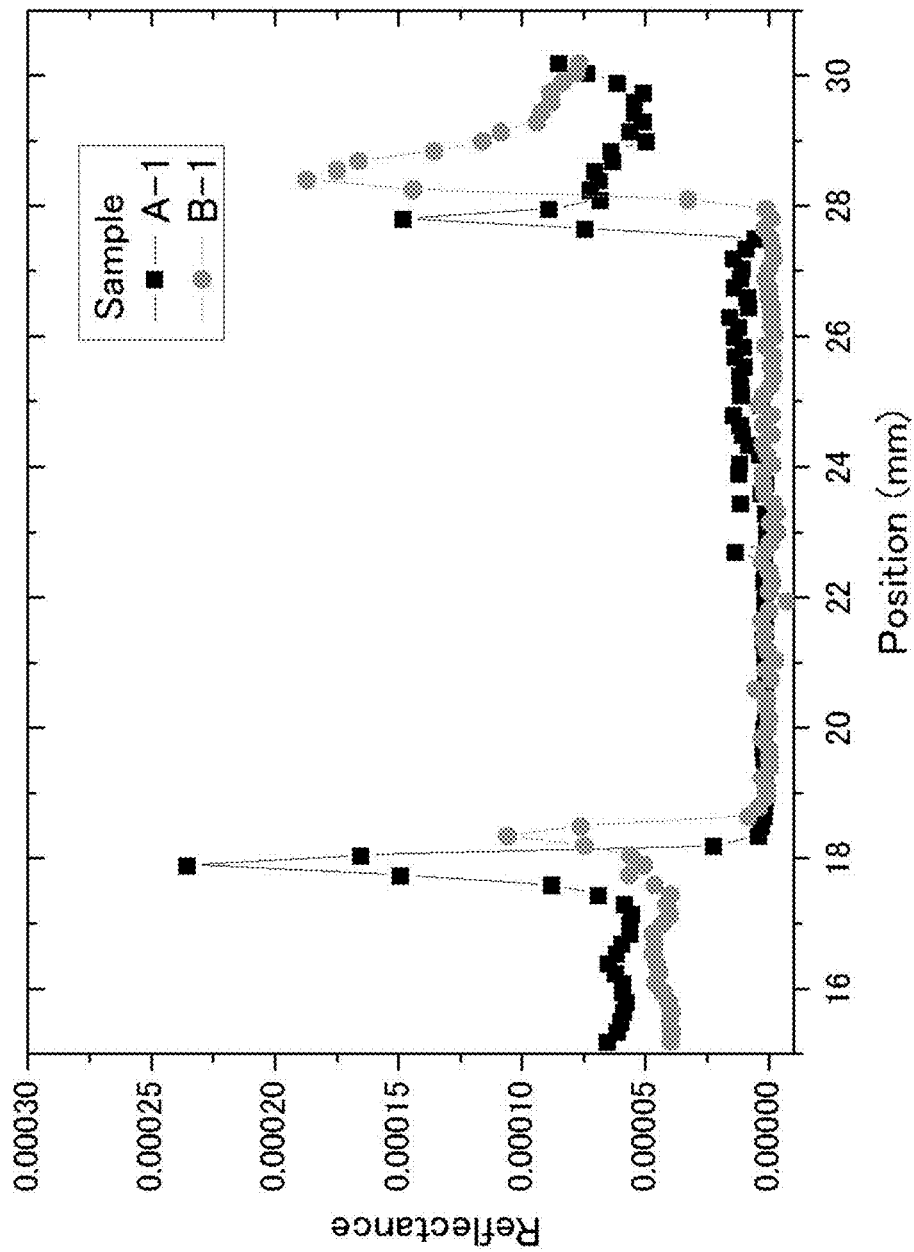
FIG. 5(B) illustrates a linear map of EUV reflectivity of two 0.6 $\mu g/cm^2$ films 1×1 $cm^2$ in size in accordance with an exemplary embodiment.

FIG. 5 illustrates EUV transparency, reflectivity and scattering of a filtration formed CNT pellicle film in accordance with an exemplary embodiment. More specifically, FIG. 5(A) illustrates a linear map of EUV transparency of two 0.6 µg/cm$^2$ films 1×1 cm$^2$ in size in accordance with an exemplary embodiment. FIG. 5(B) illustrates a linear map of EUV reflectivity of two 0.6 µg/cm$^2$ films 1×1 cm$^2$ in size in accordance with an exemplary embodiment.

As illustrated in FIG. 5, the filtration formed CNT pellicle films have a EUV transparency above 97% with exceptionally low reflectivity and scattering levels of only 0.21%. More specifically, FIG. 5(A) illustrates EUVT values ranging from 97% to 99% for both samples A and B, with majority of the EUVT values falling between 98% and 99%. As illustrated in FIG. 5(A), the CNT pellicle film provided in the present disclosure provides a very high EUVT values that were previously unrealizable. Given the high EUVT values, it can be seen in FIG. 5(B) that the CNT pellicle films have very low reflectance values, which majority of values residing below 0.00005 mm, with nearly all of the values being below 0.00010 mm. Based on the above, it can be seen that the CNT pellicle film having majority constitution (at least 50%) of DWCNT allows for nearly all of the EUV irradiation is transmitted through given the very high EUVT values and very low reflectance values.

Further, areal density of CNT pellicle film has an effect on visible light transmissivity and visible light absorbance. In this regard, FIG. 4(A) illustrates transparency and Absorbance of DWCNT films at 550 nm (e.g., visible light) for different areal densities in accordance with an exemplary embodiment.

As exemplarily illustrated in FIG. 4(A)(I), an inverse relationship between areal density and 550 nm wavelength transmissivity is present. The inverse relationship is exemplarily illustrated in FIG. 4(A)(II). At one end, an areal density of 0.62 µg/cm$^2$ results in an average 550 nm wavelength transmissivity value of 93.833%. On an opposing end, an areal density of 3.11 µg/cm$^2$ results in an average 550 nm wavelength transmissivity value of 72.900%.

On the other hand, a direct relationship between areal density and absorbance is present. The direct relationship is exemplarily illustrated in FIG. 4(A)(III). At one end, an areal density of 0.62 µg/cm$^2$ results in an average absorbance value of 0.028. On an opposing end, an areal density of 3.11 µg/cm$^2$ results in an absorbance value of 0.137.

Mechanical Properties of the CNT Pellicle for EUV

Exemplary embodiments of the present application provide CNT pellicles with sufficient and satisfactory mechanical strength for product transportation and handling. The pellicles may sustain any desired pressure changes surrounding their environment, including, but not limited to, an EUV lithography scanner environment.

A commonly applied mechanical characterization was a bulge test. For example, a membrane for testing may be attached onto the flat surface of a border, and a baseline of the membrane may be established. Then, an initial stream of inert gas may be applied at low steady pressure aiming perpendicularity at the center region of the membrane to raise the local surface. The gas pressure continues to increase incrementally to deform the membrane further until the pressure reaches a predetermined value, which is 2 Pascal for a 2 Pa deflection test. This value may also be under a flow rate of about 10 sccm, under 3.5 mbar/second, or any scanner pump down conditions. A distance between the highest tip of the deformed membrane and its baseline may be measured. The result may be recorded as the deflection at 2 Pa. Deflection tests may be performed at different pressures, other than 2 Pa.

Increasing this gas flow pressure may eventually burst the membrane. This pressure may be recorded as a rupture pressure, and the membrane deflection just before its rupture may be referred to as a rupture deflection.

Furthermore, a thin film deflection may be purposely adjusted by methods, including, but not limited to, tension adjustment by physical means or chemical means.

Figure 4D:
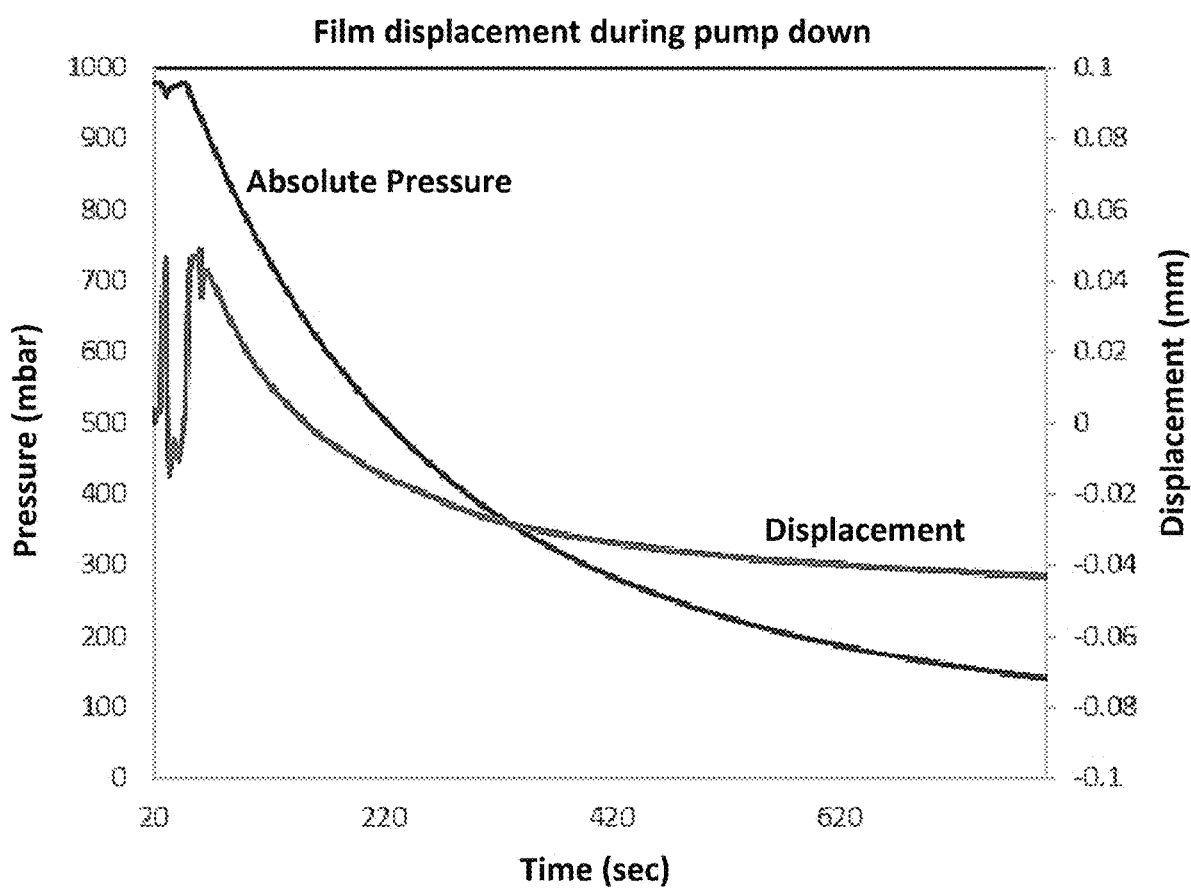
FIG. 4(D) illustrates a deflection of a film 110×140 mm and 0.65 $\mu g/cm^2$ in areal density during pumping down at a maximum rate of 3.5 mbar/sec in accordance with an exemplary embodiment.
Figure 4E:
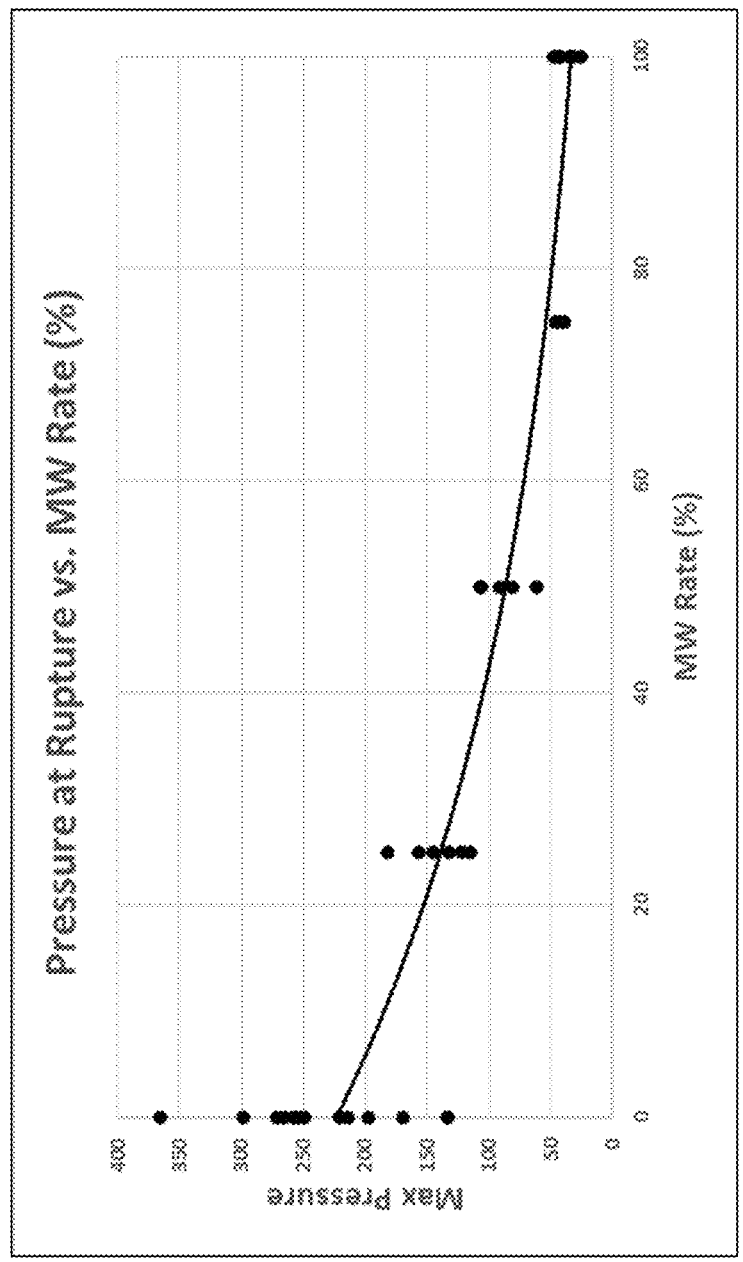
FIG. 4(E) illustrates an effect on a rupture pressure of CNT films with various DWCNT/MWCNT ratios.

FIG. 4(B) illustrates effect of the areal density on the deflection at 2 Pa constant pressure and at rupture of DWCNT dominant films 10×10 mm in size in accordance with an exemplary embodiment. FIG. 4(C) illustrates effect of MWCNT concentration on DWCNT films deflection at 2 Pa and at rupture for a films 10×10 mm and 2.9-3.0 µg/cm$^2$ in areal density. FIG. 4(D) illustrates a deflection of a film 110×140 mm and 0.65 µg/cm$^2$ in areal density during pumping down at a maximum rate of 3.5 mbar/sec in accordance with an exemplary embodiment. FIG. 4(E) illustrates the rupture pressure of films with different DWCNT/MWCNT ratios, which provides evidence to support current embodiment.

Figure 3A:
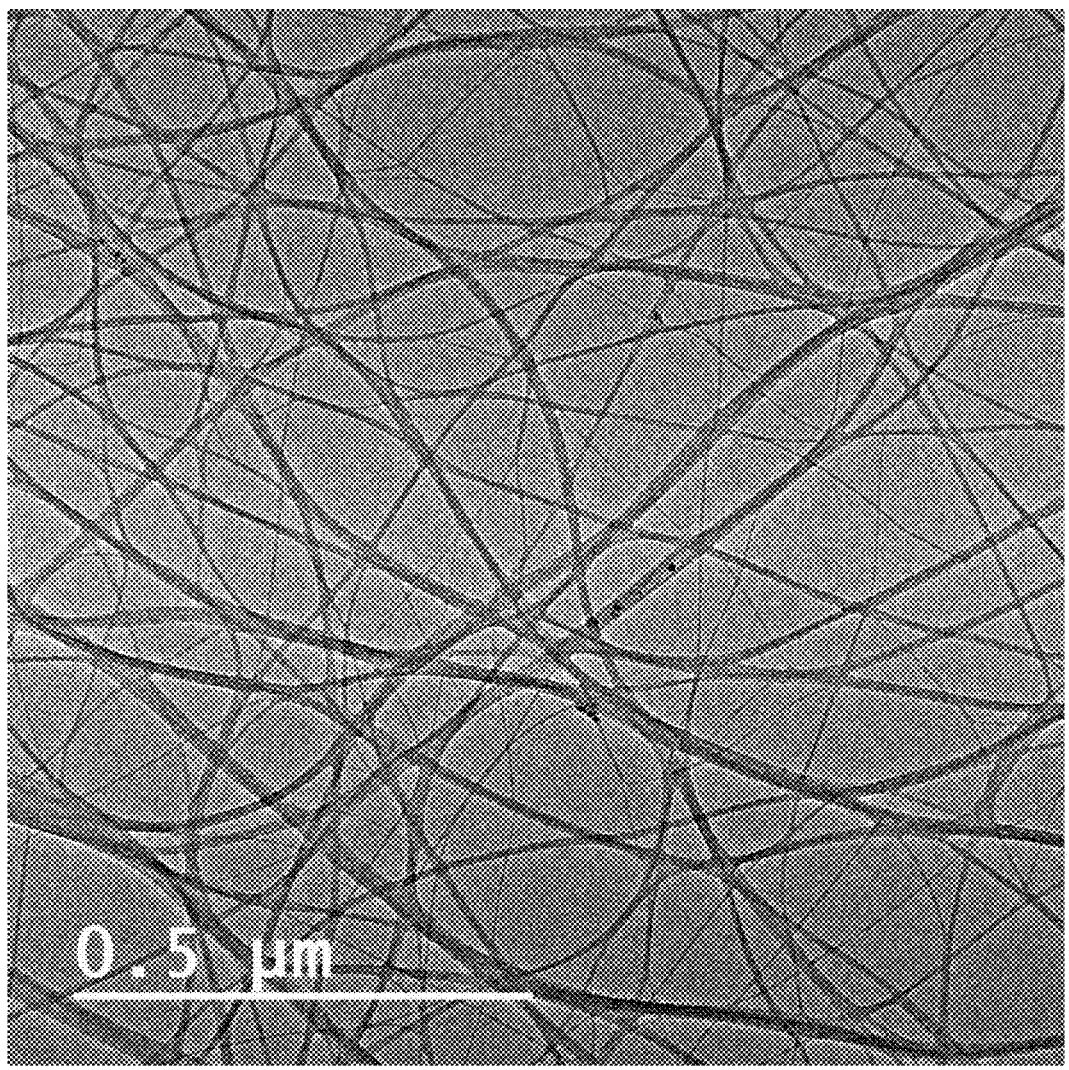
FIG. 3(A) illustrates a scanning electron microscope (SEM) image of a microstructure of a DWCNT film in accordance with an exemplary embodiment.
Figure 3B:
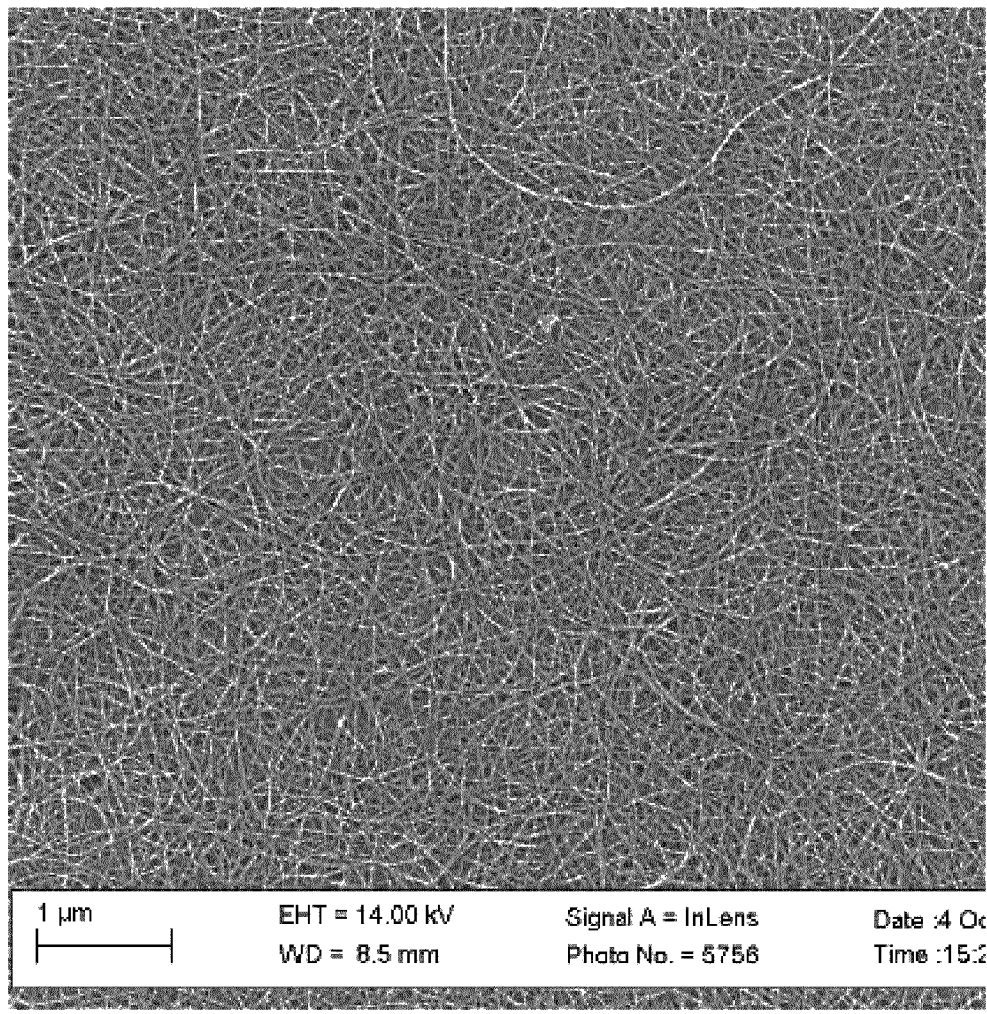
FIG. 3(B) illustrates areal densities in accordance with an exemplary embodiment.

The structure of the films may be highly porous. See e.g., FIG. 3(A) and FIG. 3(B). It may also greatly depend on the areal density. More specifically, since the films may be very porous, instead of a film thickness, an areal density (µg/cm$^2$)

may be utilized. This change of the microstructure also greatly affects the mechanical properties of the films (FIG. 4(B)). In addition, the visible light absorption is also affected. These films seem to observe Beer-Lambert law reasonably well in the range measure. See e.g., FIG. 4(A). In an example, the CNT pellicle film, including a full-size film, may have an areal density about 0.2 µg/cm$^2$ to about 6.0 µg/cm$^2$.

Based on deflection tests of full-size CNT pellicles of an exemplary embodiment, a network of CNTs forming the CNT film may have a deflection of less than 4.0 mm, less than 3.0 mm, 1.5 mm, or 0.6 mm under a constant 2 Pa pressure.

Various sizes of membrane, ranging from 1 cm×1 cm up to 12 cm×15 cm, have been tested. However, aspects of the present disclosure are not limited thereto, such that testing of other sizes not specified herein may be possible.

The microstructure of BNNT films is rather similar to the CNT films, although it has a lower aspect ratio and contains more impurities due to the nature and the low purity of the raw material available.

While a low areal density CNT film may be feasible to manufacture aiming for a high EUV transmittance, it may also render the film highly susceptible to its external pressure changes. By increasing the areal density of the CNT films, the deflection of the film at a constant pressure may be greatly reduced and the elongation at the point of rupture may be slightly increased. See e.g., FIG. 4(B).

As exemplarily illustrated in FIG. 4(B)(I), a lower areal density of 0.62 µg/cm2 results in an average deflection value of 0.098 mm at a pressure of 2 Pa, whereas a higher areal density of 3.11 µg/cm2 results in an average deflection value of 0.012 mm at a pressure of 2 Pa. The inverse relationship between the areal density and the deflection value at 2 Pa is exemplarily illustrated in FIG. 4(B)(II).

FIG. 4(B)(I) also specifies a generally direct relationship between an areal density value and a deflection value at rupturing point of the CNT film. For example, a lower areal density of 0.62 µg/cm2 results in an average deflection value of 0.289 mm at rupture, whereas a higher areal density of 3.11 µg/cm2 results in an average deflection value of 0.380 mm at rupture. The relationship between the areal density and the deflection value at rupture is exemplarily illustrated in FIG. 4(B)(III).

However, it may affect the basic EUV transparency capability, eventually making such high areal density film non-applicable for EUV lithography.

The effect of the type of CNT used (i.e., MWCNT) is shown in FIG. 4(C). MWCNT films show higher deflection at the same pressure than DWCNT films, indicating a lower Young's modulus of the film's material (softer) and a lower deflection at rupture indicating a lower elongation at rupture (more brittle). The explanation for that might be that, at the same areal density, a film made of MWCNTs will contain less nanotube total length per area than a film made of DWNCTs. That implies less contact points between the nanotubes and that might lead to a weaker material.

More specifically, FIG. 4(C)(I) illustrates average deflection values at a pressure of 2 Pa and max deflection values for various CNT film samples having different composition ratios of DWCNT and MWCNT. As provided in FIG. 4(C)(I), a CNT film composed of 100% DWCNT results in an average deflection value of 0.030 mm at a pressure of 2 Pa, and a max deflection value of 0.379 mm. Further, a CNT film composed of 75% DWCNT and 25% MWCNT results in an average deflection value of 0.029 mm at a pressure of 2 Pa, and a max deflection value of 0.345 mm. A CNT film composed of 50% DWCNT and 50% MWCNT results in an average deflection value of 0.052 mm at a pressure of 2 Pa, and a max deflection value of 0.336 mm. A CNT film composed of 25% DWCNT and 75% MWCNT results in an average deflection value of 0.072 mm at a pressure of 2 Pa, and a max deflection value of 0.307 mm. Lastly, a CNT film composed of 100% MWCNT results in an average deflection value of 0.066 mm at a pressure of 2 Pa, and a max deflection value of 0.300 mm. As illustrated in FIG. 4(C)(I), 100% MWCNT produces a deflection value at 2 Pa pressure (i.e., 0.066 mm) that is more than double of a deflection value at 2 Pa pressure for 100% DWCNT (i.e., 0.030 mm). A direct relationship between the deflection values at 2 Pa pressure and MWCNT composition rate is illustrated in FIG. 4(C)(II). An inverse relationship between the maximum deflection values and MWCNT composition rate is illustrated in FIG. 4(C)(III).

Substantially, pure DWCNT films show higher mechanical strength. FIG. 4(E) shows the rupture pressure (Pa) for different ratios of DWCNT to MWCNT. All the films had similar areal density and transparency. The DWCNTs are significantly stronger than MWCNT.

FIG. 2 illustrates that a CNT film consisting mostly of single wall carbon nanotubes has largely different values from the CNT films, which have majority composition of double-wall carbon nanotubes. FIG. 2 further illustrates an average deflection value of 0.0967 mm measured at 2 Pa for DWCNT dominant CNT films, which is roughly double the lower range value of 0.0473 mm for the SWCNT film. Further, the SWCNT film exhibits a much lower average rupture pressure of 66.61 Pa. Lastly, an average rupture deflection of 0.498 mm is provided for the DWCNT dominant CNT film vs. 0.097 mm provided for the SWCNT film. Also, in FIG. 2, a composite MWCNT film with comparable size again show its weakness in rupture pressure and deflection compared to DWCNT dominant CNT films.

As exemplarily illustrated in FIG. 2, a CNT film composed of majority DWCNT (e.g., at least 50%) has noticeably lower deflection with higher transmittance, and noticeably higher rupture resistance indicating higher structural strength.

Lifetime Test

An exemplary life-time test of a filtration formed CNT pellicle film in accordance with an exemplary embodiment. The 1×1 cm$^2$ CNT pellicle remains intact after EVU irradiation. It was exposed to a dose of 73 kJ/cm$^2$ at the power of 5.1 W/cm$^2$.

Further, EUV irradiation test of a full-size CNT pellicle with a dose equivalent to 90 kJ/cm$^2$ (equivalent to a 600 watts energy source) at the power of 20 W/cm$^2$ for 4 hours demonstrated an undisrupted CNT film. This testing dose may be equivalent to a total amount of irradiation required to process approximately 32,000 wafers.

As provided above, the inventors demonstrated the capability to produce free-standing, nanoparticle films with adequate dimensions to be use as EUV pellicles in an EUV scanner environment. When made of sufficiently thin, a single layer of CNT material, these films have high EUV transparency (e.g., greater than 92%), low scattering (e.g., less than 0.3%) and retain sufficient mechanically stability and porosity to stand shipping, handling and pumping down operation (e.g., less than 0.1 mm deflection at 3.5 mbar/sec pumping down) for a full-size EVU pellicle.

Furthermore, the films survive EUV irradiation in doses and powers equivalent to a 250 W-600 W EUV scanner.

The illustrations of the embodiments described herein are intended to provide a general understanding of the various embodiments. The illustrations are not intended to serve as a complete description of all of the elements and features of products and methods that form the products or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A nanostructure film comprising:
a plurality of carbon nanofibers that are intersected randomly to form an interconnected network structure in a planar orientation, the interconnected network structure having a thickness ranging from a lower limit of 3 nm to an upper limit of 100 nm, and a minimum EUV transmission rate of 92%,
wherein the plurality of carbon nanofibers includes at least 50% of double-walled carbon nanofibers.

2. The nanostructure film according to claim 1, wherein the thickness ranges from the lower limit of 3 nm to an upper limit of 40 nm.

3. The nanostructure film according to claim 1, wherein the thickness ranges from the lower limit of 3 nm to an upper limit of 20 nm.

4. The nanostructure film according to claim 1, wherein an average thickness of the interconnected network structure is 11 nm.

5. The nanostructure film according to claim 1, wherein an EUV transmission rate rises to above 95%.

6. The nanostructure film according to claim 1, wherein an EUV transmission rate rises to above 98%.

7. The nanostructure film according to claim 1,
wherein the plurality of carbon nanofibers further includes single-walled carbon nanotubes and multi-walled carbon nanotubes, and
wherein a number of walls of single-walled carbon nanotubes is one, a number of walls of the double-walled carbon nanotubes is two, and a number of walls of the multi-walled carbon nanotubes is three or more.

8. The nanostructure film according to claim 7, wherein the single-walled carbon nanotubes account for a percentage between 20-40% of all carbon nanotubes, double-walled carbon nanotubes account for a percentage 50% or higher of all carbon nanotubes, the remaining carbon nanotubes are multi-walled carbon nanotubes.

9. The nanostructure film according to claim 7, wherein the single-walled carbon nanotubes account for more than 20% of all carbon nanotubes, double-walled carbon nanotubes account for more than 75% of all carbon nanotubes, the remaining carbon nanotubes are multi-walled carbon nanotubes that account for a remaining percentage of all carbon nanotubes.

10. The nanostructure film according to claim 8, wherein the difference of any two EUV transmission measurements from the same nanostructure film at any focused area is less than 5%.

11. The nanostructure film according to claim 10, wherein the difference of any two EUV transmission measurements from the same nanostructure film at any focused area is less than 2%.

12. The nanostructure film according to claim 11, wherein the difference of any two EUV transmission measurements from the same nanostructure film at any focused area is less than 0.4%.

13. The nanostructured film according to claim 1, wherein the interconnected network structure has a deflection of less than 3.5 mm under a flow rate of 10 sccm.

14. The nanostructured film according to claim 13, wherein the deflection is less than 0.6 mm under a flow rate of 10 sccm.

15. The nanostructured film according to claim 1, wherein the interconnected network structure has a deflection of less than 0.1 mm under a flow rate of 3.5 mbar/second.

16. The nanostructured film according to claim 1, wherein the interconnected network structure produces a scattering of less than 0.3% under EUV irradiation.

17. The nanostructured film according to claim 1, wherein the nanoparticles are conformally coated with a metal, metal oxide or nitrides, the metal being selected from boron, ruthenium, zirconium, niobium, molybdenum, rubidium, yttrium, strontium, or rhodium.

18. The nanostructured film according to claim 5, wherein the nanostructured film has an areal density of about 0.2 $\mu g/cm^2$ to about 6.0 $\mu g/cm^2$.

19. The nanostructured film according to claim 1, wherein the interconnected network structure with a size of 140 mm×110 nm has a deflection of less than 2.5 mm under a flow rate of 3.5 mbar/second.

20. The nanostructure film according to claim 19, wherein the deflection is less than 0.5 mm.

21. The nanostructure film according to claim 1, wherein an EUV transmission rate is in a range between the minimum transmission rate of 92% and a maximum transmission rate of 99%.

22. A pellicle, comprising:
a pellicle border defining an aperture, and
at least one nanostructured film mounted to the pellicle border and covering the aperture,
wherein the at least one nanostructured film includes:
a plurality of carbon nanofibers that are intersected randomly to form an interconnected network structure in a planar orientation, the interconnected network structure having a thickness ranging from a lower limit of 3 nm to an upper limit of 100 nm, and a minimum EUV transmission rate of 92%,
wherein the plurality of carbon nanofibers includes at least 50% of double-walled carbon nanofibers.

23. The pellicle of claim 22, wherein the aperture of the pellicle border is 140 mm×110 mm and the at least one nanostructured film has a deflection less than 2.5 mm under a flow rate of 3.5 mbar/second.

24. The pellicle of claim 23, wherein the deflection is less than 0.5 mm.

25. A method of performing EUV lithography, comprising transmitting EUV radiation through a pellicle,
the pellicle including:
a pellicle border defining an aperture, and
at least one nanostructured film mounted to the pellicle border and covering the aperture,
wherein the at least one nanostructured film includes:
a plurality of carbon nanofibers that are intersected randomly to form an interconnected network structure in a planar orientation, the interconnected network structure having a thickness ranging from a lower limit of 3 nm to an upper limit of 100 nm, and a minimum EUV transmission rate of 92%,
wherein the plurality of carbon nanofibers includes at least 50% of double-walled carbon nanofibers.

* * * * *

UNITED STATES PATENT AND TRADEMARK OFFICE
CERTIFICATE OF CORRECTION

| | | |
|---|---|---|
| PATENT NO. | : 11,740,548 B2 | Page 1 of 1 |
| APPLICATION NO. | : 18/074082 | |
| DATED | : August 29, 2023 | |
| INVENTOR(S) | : Marcio D. Lima et al. | |

It is certified that error appears in the above-identified patent and that said Letters Patent is hereby corrected as shown below:

In the Claims

Column 14, Line 66 (Claim 19, Line 3), please change "nm" to -- mm --.

Signed and Sealed this
Sixteenth Day of April, 2024

*Katherine Kelly Vidal*

Katherine Kelly Vidal
*Director of the United States Patent and Trademark Office*